United States Patent [19]

Dick et al.

[11] Patent Number: 4,689,441
[45] Date of Patent: Aug. 25, 1987

[54] ROUTING METHOD AND PATTERN FOR REDUCING CROSS TALK NOISE PROBLEMS ON PRINTED INTERCONNECTION BOARDS

[75] Inventors: Carroll J. Dick, Dryden; Ralph Linsker, Scarsdale; Roger S. Rutter; David L. Thomas, both of Vestal, all of N.Y.

[73] Assignee: International Business Machines Corporation, Armonk, N.Y.

[21] Appl. No.: 720,127

[22] Filed: Apr. 5, 1985

[51] Int. Cl.⁴ .............................................. H05K 1/00
[52] U.S. Cl. .................................... 174/68.5; 361/409
[58] Field of Search .................. 174/68.5, 32; 333/12; 307/89, 90, 91; 179/78 R; 361/409; 178/43

[56] References Cited

U.S. PATENT DOCUMENTS 3,631,300 12/1971 Humble ............................... 361/409
4,489,364 12/1984 Chance et al. ...................... 361/409
4,571,451 2/1986 Linsker et al. ...................... 174/68.5

FOREIGN PATENT DOCUMENTS 111098 7/1982 Japan.
115893 7/1982 Japan.

OTHER PUBLICATIONS

IBM Technical Disclosure Bulletin; Bilodeau et al; vol. 25, No. 6, dated Nov. 1982, "Coupled Noise Reducer", pp. 3101-3102.

Primary Examiner—Morris H. Nimmo
Attorney, Agent, or Firm—Morgan & Finnegan

[57] ABSTRACT

In printed circuit boards having dense printed connections, cross talk noise immunity is significantly improved by preferentially routing adjacent to one another serially connected conductors of the same net rather than conductors of different nets. By such routing inter-net cross talk is reduced while the resultant intra-net cross talk is maintained at tolerable levels.

18 Claims, 5 Drawing Figures

ROUTING METHOD AND PATTERN FOR REDUCING CROSS TALK NOISE PROBLEMS ON PRINTED INTERCONNECTION BOARDS

DESCRIPTION

1. Technical Field

This invention relates to printed circuit boards, and more particularly, to a routing method and pattern for reducing cross talk noise between printed interconnections running to densely packed arrays of pins located underneath modules mounted on printed circuit boards.

As electronic circuits become more complex, the required number of interconnections between components increases commensurately. While increased numbers of interconnections can, in and of themselves, present complex routing problems, such problems are very often compounded by the need or desire to make the size of electronic equipment as small as possible. The density of interconnections routed on a printed interconnection board very often is limited more by cross talk considerations than by available routing space. Cross talk is defined as spurious signals induced in a first wire by a varying field from a nearby second wire. Normally, cross talk can be controlled by large line-to-line spacing, by keeping adjacent line segments short, and by choosing proper design parameters when creating a basic printed circuit board topology for a selected circuit configuration. Cross talk can also be controlled by not running lines adjacent to one another, however, this approach can result in decreased wiring density.

One application where such solutions to cross talk problems are of limited usefulness is where a printed circuit board is divided into component and non-component regions. In non-component regions, relatively large line-to-line spacings may be maintained to avoid significant cross talk problems. In component regions, however, where large numbers of component pins and other terminals limit routing space, interconnection lines must be spaced more closely together to allow such lines to be routed around the pins and terminals with sufficient clearance. This compressing of interconnection lines in the component pin areas increases the potential for cross talk to occur. This problem is amplified by the increasing use of larger multi-pin components, such as multi-layer modules carrying large numbers of chips or the like, which require the use of long, closely routed line segments for reaching large numbers of inner under-component pins. These segments are often sufficiently long to allow cross talk to be induced between them at levels that may not be tolerable. This is particularly likely to occur where two such segments lie adjacent to one another in the same wiring channel, i.e., in the space between rows or columns of pins of a multi-pin component. Prohibiting long, under-component connections from being routed adjacent to other lines is not a viable solution because this type of constraint may prevent all the required connections from being completed. Accordingly, there is a need to provide a technique for reducing cross talk in applications where adjacent interconnection lines run under large multi-pin circuit board components having relatively dense pin patterns.

2. Background Art

Efforts to reduce cross talk problems have been ongoing in the art. Illustrative of these efforts are the techniques described in the following publications:

An IBM Technical Disclosure Bulletin of Bilodeau et al., Vol. 25, No. 6, dated November 1982, and entitled "Coupled Noise Reducer", discloses at pages 3101–02 a technique of reducing electrically coupled noise between long metal lines on a dielectric substrate for packaging I.C. chips, by providing material with a high dielectric constant in close proximity over the lines, while leaving an air gap between the lines.

Japanese Laid Open Patent Publication No. 57-111098 of 1982 discloses a technique for reducing cross talk to allow increased density of wiring in which all, or a portion of a wiring pattern is covered with an insulating layer, which, in turn, is wholly or partially covered by an electric conductor layer connected to a suitable potential such as ground.

Japanese Laid Open Patent Publication No. 57-115893 of 1982 discloses a wiring technique for reducing cross talk between connections in which specific circuits, differentiated from the general wiring, are wired using conductors having a smaller diameter than those used for the general wiring.

SUMMARY OF THE INVENTION

The present invention is directed to a technique for reducing cross talk noise in interconnection lines running to densely packed arrays of pins typically located under large components, such as multi-chip modules, mounted on circuit boards. It encompasses a wire routing method and pattern wherein adjacencies between conductors of different nets (wiring networks) are preferably avoided in favor of adjacencies between conductors of the same net such that inter-net cross talk is reduced without inducing excessive intra-net cross talk.

In a typical application, pairs of conductors in the path of a given signal having a common intermediate connecting point in such a net (often a component pin) are preferably routed adjacent to one another rather than adjacent to interconnection lines within other, different nets. According to the present invention, this adjacent routing is typically done within the same wiring channel and wiring plane or corresponding tracks of non-isolated planes of a circuit board. Such preferential adjacency is accorded to those nets which either cause intolerable levels of cross talk in adjacent nets, or have relatively high cross talk sensitivity, and which are relatively insensitive to timing delays in signal propagation. Application to nets sensitive to time delays can be realized where no additional wiring length is required. Even if additional wiring is required, the method can be used where it will not cause excessive propagation delays. Application of the invention may be limited where it results in such additional wiring length as to cause an unacceptable reduction in wiring density.

The rule can also be incorporated in algorithms used in designing printed circuit board layouts, including the assigning of module signal pins and the placement of terminator pins. Such algorithms or design parameters, which are related to design constraints imposed by spatial criteria, component size, noise, heat, radiation, stable operation, cross talk and the like, may be modified or supplemented by the rule.

The giving of priority to the adjacent routing of conductors of the same net over conductors of different nets is accomplished without creating excessive cross talk within the net. The cross talk induced in the initially quiet line of the two connections of such a net by the active line of the two is of the same polarity as, but smaller in magnitude than the original signal appearing in the active line. The cross talk signal arrives at the next terminal point in the net slightly ahead of the original signal. Thus, the resulting noise commonly appears as nothing more than a slight displacement of the original signal in time. Thus the cross talk noise susceptability of the circuit as a whole is reduced by substituting the harmless cross talk induced between adjacent lines in the same net for the potentially intolerable cross talk induced between adjacent lines in separate nets. By so reducing adverse cross talk, improved wiring density can be achieved since wiring space adjacent to a connection can be used for routing another connection in the same net, i.e., by making fuller use of available wiring channels.

BRIEF DESCRIPTION OF THE DRAWINGS

FIG. 6 illustrates the signal of FIG. 3 affected by intra-net cross talk.

DETAILED DESCRIPTION OF THE PREFERRED EMBODIMENT OF THE INVENTION

Figure 1:
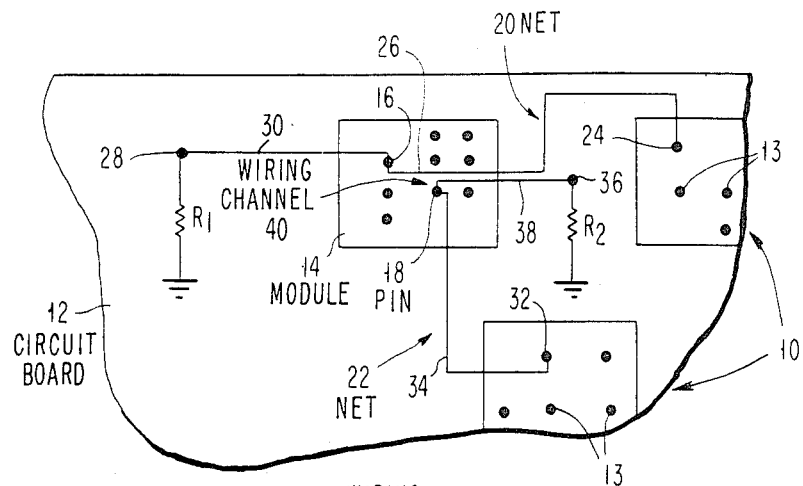
FIG. 1 is a partial schematic of two nets wired in a conventional manner.

FIG. 1 is a partial schematic of an electronic circuit assembly which includes a number of interconnected multi-layer modules 10 mounted on a multi-level circuit board 12 which, in turn, includes one or more wiring planes (not shown) for routing interconnections between module pins and other circuit terminals. The illustrated modules mounted on circuit board 12 are, e.g., ten centimeters square in size and typically have a large number of chips or the like (not shown) incorporated in them. Each of these modules is also typically provided with a large number of pins 13 (most of which are not shown) for interconnecting it to other modules and components mounted on the circuit board.

One of the modules 14 shown in FIG. 1 includes two pins 16 and 18 which are intermediate points in two separate nets 20 and 22, respectively. A net is defined as the path of a given signal, and it includes the end and intermediate points in the path, and the interconnections therebetween. As shown in FIG. 1, net 20 includes a first end point 24 which is one pin of a component, e.g., a driver (not shown); a second, intermediate point, pin 16 of module 14, which is also one pine of a component, e.g., a receiver (not shown); and another end point 28, which is connected to a terminating resistor $R_1$. Points 24 and 16, and 28 and 16, are interconnected respectively by a line 26 and a line 30.

The other net 22 shown in FIG. 1, which is similar to that of first net 20, includes end points 32 and 36 of a driver and resistor $R_2$, respectively and an intermediate point 18, e.g. a pin of a receiver (not shown). Lines 34 and 38 interconnect the end points with intermediate pin 18. It should be noted that line 38 of net 22 shares channel 40 bordered by pins 16 and 18, with line 26 of the first net.

Wiring channels such as 40 occupy the space between adjacent rows or columns of pins under the multi-pin modules. Because such components generally include large numbers of pins for interconnections, the space available within a wiring channel is often very small. Typically, there are at least two wiring tracks or subspaces within each wiring channel, each for running a line. The number of tracks available is dependent upon such factors as pin spacing and line dimensions. Wiring channels commonly extend in mutually orthogonal directions underneath a given module.

Figure 3:
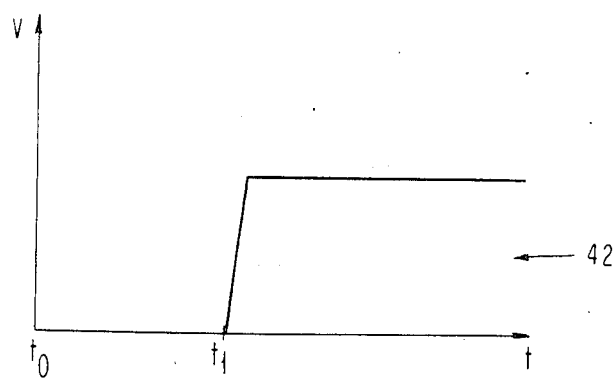
FIG. 3 displays a waveform depicting voltage as a function of time of a signal switching from logic zero to logic one.
Figure 4:
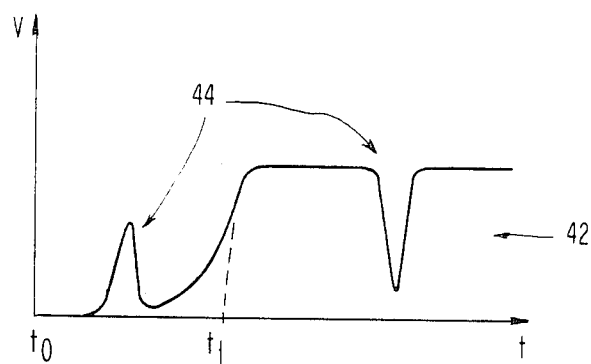
FIG. 4 illustrates the signal of FIG. 3 affected by inter-net cross talk.

Referring now to FIGS. 1, 3 and 4, to illustrate the problems of circuits wired in accordance with prior practices, it is assumed that a signal similar in shape to the signal waveform 42 shown in FIG. 3 is generated at pin 32 at time $t_0$ and arrives at pin 36 of terminating resistor $R_2$ at time $t_1$. It is also assumed that adjacent line 26 of net 20 is quiet during this period, i.e., no signal switching is occurring thereon. Under these conditions, the voltage seen across $R_2$ has the waveform shown in FIG. 3.

If it is now assumed that line 26 of net 20 is active, i.e., signal switching is occurring thereon, and that lines 26 and 38 are sufficiently long and close enough for significant cross talk to be coupled into line 38 from line 26, the voltage appearing across resistor $R_2$ is likely to be different from that shown in FIG. 3, depending upon the nature of the signal activity on line 26. FIG. 4 shows the signal waveform 42 in a form that is one example of how such a signal can be distorted. As shown in the Figure, rapid switching in the signal carried by line 26 can induce spiking 44 in line 38 during the period $t_0$ to $t_1$ when there should be no signal activity on that line, and also thereafter when a constant level is desired. False switching or other spurious responses can result.

Figure 2:
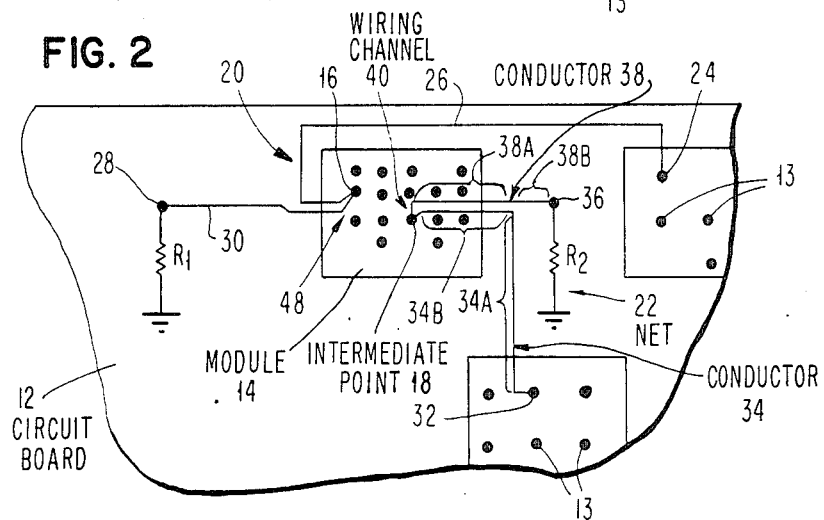
FIG. 2 is a partial schematic of the two nets shown in FIG. 1 wired in accordance with the present invention.

FIG. 2 illustrates schematically the electronic circuit of FIG. 1 wherein the line interconnections have been re-routed in accordance with the routing pattern of the present invention to minimize the effect of cross talk. As can be seen in FIG. 2, component pin 18 remains as an intermediate point in net 22. As in FIG. 1, it is connected to end point 32 through line 34, having sections 34A and 34B, and to end point 36, through line 38, having sections 38A and 38B. Here however, section 34B of line 34 and section 38A of line 38 are routed adjacent one another to intermediate point 18 through the same wiring channel 40. To accommodate this routing change, interconnection line 26 of the other net is also re-routed to intermediate pin 16 of net 20 through a different routing region 48 of the same or a different channel to make space for the two interconnection line sections 34B and 38A in wiring channel 40.

Figure 5:
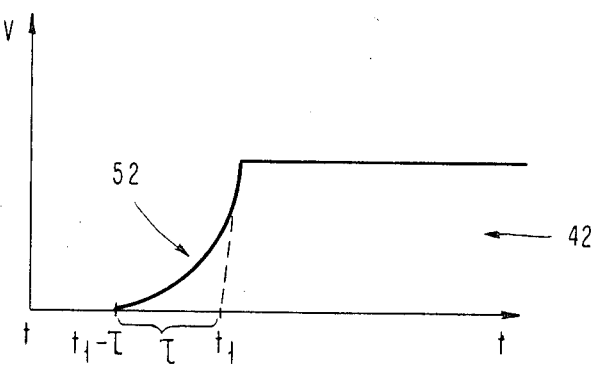

To illustrate the operation of the present invention it is assumed that in the circuit shown in FIG. 2 a drive signal, similar in shape to signal 42 of FIG. 3 is transmitted from driver pin 32 to intermediate receiver pin 18, and thereafter, to end pin 36 of resistor $R_2$. Segment 38B of line 38 is initially the segment of line 38 affected by cross talk from the signal propagating along "upstream" section 34B. Thereafter, as this signal propagates closer to pin 18 segment 38A of line 38 begins to be increasingly affected by cross talk from it. The noise induced into segments 38A and B is of the same polarity as the signal transmitted along line 34B. This noise signal 52, which is shown in FIG. 5, appears across resistor $R_2$ beginning at a time $t_1 - \tau$ ahead of the time of arrival $t_1$ of the original signal 42 at resistor $R_2$. The time 96 by which the noise signal precedes the original signal is equal to twice the time required for the original signal 42 to propagate along segment 34B of line 34, i.e., along the section parallel to section 38A of line 38.

When the original signal 42 arrives at section 38A of line 38, section 34B of line 34 becomes the segment of net 22 affected by cross talk; however, the cross talk induced into this segment tends to reinforce the signal propagating along now active line 38.

As shown in FIG. 5, the cross talk 52 generated by this arrangement effectively produces a leading displacement in time of the original signal 42. If the time $\tau$ by which the coupled noise signal precedes the original signal is short compared to the rise time of the original signal, the noise sensitivity of the net will be further reduced.

As can be seen in FIG. 2, line 26 has also been routed according to the present invention so that it lies partially in channel 48 adjacent to line 30 of the same net and away from lines 34 and 38 of the other net, thereby reducing inter-net cross talk. Of course, it should be understood that the opportunity to simultaneously reroute the adjacent lines of two separate nets in accordance with the present invention may not always be available.

The routing pattern of the present invention is preferably used with nets that are intolerant of noise from other signal lines. In those noise sensitive nets where the time required to propagate a signal is critical, the present invention would ordinarily be used where no significant additional wire length is required in satisfying the preferred wiring topology. One example of this is the circuit shown for net 22 in FIGS. 1 and 2.

The preferential routing technique of the present invention can have important consequences in the elimination of cross talk noise problems. For example, in circuit designs in which line termination is implemented using discrete terminating components such as resistors mounted on the circuit board, at least one intermediate point occurs in each terminated net. If this termination configuration appears frequently, a large number of undesired adjacencies of interconnection lines of separate nets running to densely packed arrays of pins (see, e.g., lines 26 and 38 of FIG. 1) may be eliminated through the routing pattern of the present invention.

The wiring pattern of the present invention may also be used in nets having an intermediate point with several lines connected to it. One example of such a connection is a "T" connection in which three lines are connected to an intermediate point of a net. In nets of this type, generally, one of the lines carrying a signal to the intermediate point would be run adjacent to one of the lines carrying a signal away from the intermediate point to reduce cross talk.

While the invention has been particularly shown and described with respect to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. In a circuit disposed on or within a wiring media and including a plurality of nets adjacently routed for adjacency lengths exceeding an inter-net adjacency routing limit thereby subjecting said plurality of nets to cross-talk inducing signals, anyone net of said nets having at least a first end point, an intermediate point, a second end point, a first conductor of said net interconnecting said first end point to said intermediate point, and a second conductor of said net interconecting said intermediate point to said second end point the improvement comprising a wiring pattern for reducing inter-net cross talk wherein said first and second conductors of said net are adjacently routed to one another for an adjacency length that does not exceed an intra-net adjacency routing limit for said net.

2. The improved wiring pattern as defined in claim 1 wherein said routing is dimensioned to accomodate both cross talk minimization and propagation time requirements.

3. The improved wiring pattern as defined in claim 1 wherein said adjacent routing is such that cross talk has the same polarity as, and an amplitude lower than the active, cross talk-inducing signal, and wherein said cross talk leads said active signal by a time equal to twice the time required for said active signal to propagate the distance said first and second conductors run adjacent one another.

4. The improved wiring pattern as defined in claim 2 wherein said adjacent routing is such that cross talk has the same polarity as, and an amplitude lower than the active, cross talk-inducing signal, and wherein said cross talk leads said active signal by a time equal to twice the time required for said active signal to propagate the distance said first and second conductors run adjacent one another.

5. The improved wiring pattern as defined in claim 4 wherein said adjacent routing is such that cross talk constitutes a displacement in time of said active signal equal to or less than the transition time required for said active signal to change logic states.

6. The improved wiring pattern as defined in claim 1 wherein said first and second conductors are routed in immediately adjacent parallel wiring tracks of a single wiring channel.

7. The improved wiring pattern as defined in claim 2 wherein said first and second conductors are routed in immediately adjacent parallel wiring tracks of a single wiring channel.

8. The improved wiring pattern as defined in claim 1 wherein said adjacent routing of said first and second conductors is configured to replace inter-net cross talk with intra-net cross talk without substantially reducing wiring density.

9. The improved wiring pattern as defined in claim 2 wherein said adjacent routing of said first and second conductors is configured to replace inter-net cross talk with intra-net cross talk without substantially reducing wiring density.

10. A printed circuit board which includes a plurality of cross talk sensitive nets having a topology which includes the routing of conductors of the same net rather than those of different nets in channels of said board, where greater density can be achieved without violating intra-net adjacency routing length limits.

11. The board as defined in claim 10 in which said conductors are serially interconnected at an intermediate pin.

12. In the method of constructing a circuit which includes at least two nets, one for carrying a signal having the potential of inducing excessive cross talk in the other and wherein at least one of said nets comprises a first end point, an intermediate point, a second end point, a first conductor of said net interconnecting said first end point to said intermediate point, and a second conductor of said net interconnecting said intermediate point with said second end point the improvement comprising:

routing said first and second conductors to run adjacent one another for an adjacency length that does not exceed an intra-net adjacency routing limit in said net.

13. A method as defined in claim 12 wherein said first and second conductors are routed adjacent to one another a distance D such that the induced cross talk has the same polarity as, and an amplitude lower than the active, cross talk-inducing, signal in said first and second conductors, and leads said active signal by a time equal to twice the time required for said active signal to propagate said distance D.

14. A method as defined in claim 12 wherein the step of routing said first and second conductors to run adjacent to one another comprises routing them in immediately adjacent parallel wiring tracks of a single wiring channel.

15. In the process of computing the topology of printed conductor patterns for interconnecting components in a plurality of nets on a substrate wherein said nets each include first and second conductors interconnected at a common intermediate point and wherein conductor layout is determined according to rules related to component location, spatial parameters, propagation time, stability, radiation, heat, noise and cross talk, the improvement comprising including among said process-controlling rules, for the purposes of minimizing cross talk, the preferred routing adjacent one another of said first and second conductors of a common net rather than conductors from different nets.

16. The process according to claim 15 wherein the computer layout comprises the routing of said adjacent conductors substantially in parallel in a channel bordered by pins of said components.

17. The process according to claim 15 in which one of said conductors connected to said common intermediate point is initially active while the other is initially quiet.

18. The process according to claim 16 in which one of said conductors connected to said common intermediate point is initially active while the other is initially quiet.

* * * * *